(12) United States Patent
Shiratani et al.

(10) Patent No.: US 8,334,210 B2
(45) Date of Patent: Dec. 18, 2012

(54) METHOD AND APPARATUS OF MANUFACTURING SEMICONDUCTOR DEVICE

(75) Inventors: Masafumi Shiratani, Kanagawa (JP); Tomotake Morita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 959 days.

(21) Appl. No.: 11/847,124

(22) Filed: Aug. 29, 2007

(65) Prior Publication Data

US 2008/0057837 A1    Mar. 6, 2008

(30) Foreign Application Priority Data

Sep. 4, 2006 (JP) .................................. 2006-238654
Aug. 27, 2007 (JP) .................................. 2007-220122

(51) Int. Cl.
*H01L 21/461* (2006.01)

(52) U.S. Cl. ........ 438/692; 438/643; 438/689; 438/693; 451/5; 451/28; 451/51; 216/38; 216/89; 216/90

(58) Field of Classification Search .................. 438/692, 438/643, 689, 693; 216/38, 89, 90; 451/5, 451/28, 51
See application file for complete search history.

(56) References Cited

U.S. PATENT DOCUMENTS

| 6,046,099 | A * | 4/2000 | Cadien et al. ................. 438/622 |
| 6,432,825 | B1 * | 8/2002 | Torii ............................. 438/692 |
| 6,830,504 | B1 * | 12/2004 | Chen et al. ...................... 451/57 |
| 7,041,599 | B1 * | 5/2006 | Li et al. ........................ 438/692 |
| 7,104,869 | B2 * | 9/2006 | Tsai et al. ....................... 451/41 |
| 8,129,278 | B2 * | 3/2012 | Neo et al. ...................... 438/692 |
| 2005/0026442 | A1 * | 2/2005 | Li et al. ........................ 438/692 |
| 2005/0106872 | A1 * | 5/2005 | Hong et al. .................... 438/689 |
| 2005/0236368 | A1 * | 10/2005 | Akao ............................. 216/88 |
| 2005/0282380 | A1 * | 12/2005 | Tsai et al. ..................... 438/626 |

FOREIGN PATENT DOCUMENTS

| JP | 2000-173959 A | 6/2000 |
| JP | 2004-296596 A | 10/2004 |
| TW | 458852 B | 10/2001 |

* cited by examiner

*Primary Examiner* — Nadine Norton
*Assistant Examiner* — Christopher Remavege
(74) *Attorney, Agent, or Firm* — Sughrue Mion, PLLC (57) ABSTRACT

A method of manufacturing a semiconductor device, includes: (a) obtaining a surface of a polishing target, wherein an insulating film and a metal film are exposed; and (b) polishing the surface having the exposed insulating film and the exposed metal film. The step (b) includes; (b1) polishing the surface in a condition with high frictional force, and (b2) polishing the surface in a condition with usual frictional force lower than the high frictional force after the step (b1).

19 Claims, 12 Drawing Sheets

METHOD AND APPARATUS OF MANUFACTURING SEMICONDUCTOR DEVICE

BACKGROUND OF THE INVENTION

1. Field of the Invention

The present invention relates to a method and an apparatus of manufacturing a semiconductor device. More particularly, the present invention relates to a method and an apparatus of manufacturing a semiconductor device, which have a process of polishing a wafer.

2. Description of Related Art

At a process of manufacturing a semiconductor device, there is a case of carrying out a polishing to flatten a surface. The polishing is carried out, for example, in a process of flattening an inter-layer insulating film, a process of forming an isolation of transistors, a process of forming a contact to connect a transistor and an upper wiring layer, a process of forming a metal wiring, and the like. There is a case that such surface polishing at those processes is carried out not only to flatten the surface but also to remove the unnecessary film.

For example, at the process of forming the contact and the process of forming the metal wiring, a concave portion is formed in an insulating film layer, and the metal film is embedded in this concave portion by using a sputtering method, a CVD method and the like. Here, the metal film is formed even on the surface except the concave portion. The metal film formed on a portion except the concave portion is required to be removed. Since the surface is polished, the metal film formed on the unnecessary portion is removed.

Figure 1A:
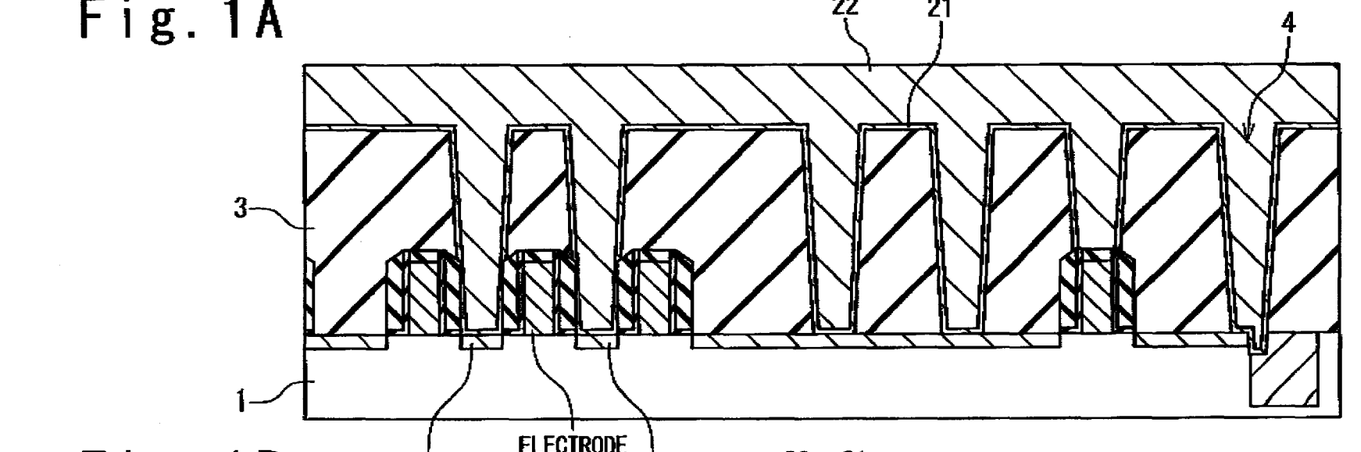
FIG. 1A is a sectional view showing a wafer before a polishing.
Figure 1B:
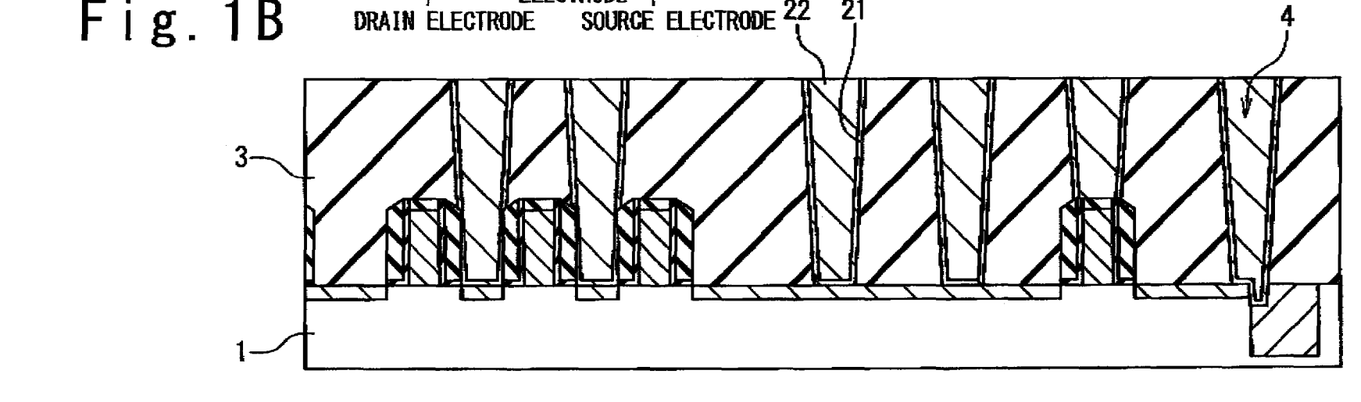
FIG. 1B is a sectional view showing the wafer after the polishing.

As one example of such polishing, the polishing at the process of forming the contact will be described below. FIGS. 1A, 1B are sectional views showing polishing targets before and after the polishing. FIG. 1A shows the sectional view before the polishing, and FIG. 1B shows the sectional view after the polishing. As shown in FIG. 1A, an inter-layer insulating film 3 is provided on a substrate 1. Holes 4 are formed in the inter-layer insulating film 3 to attain electric connections between an electrode and source/drain regions and an upper wiring layer. A metal film 2 including a lamination layer 21 made of TiN/Ti and a tungsten film layer 22 is embedded in the hole 4. When the metal film 2 is embedded by using the sputtering method or the CVD method, the metal film 2 is formed on the inter-layer insulating film 3 in addition to the holes 4, unless a special idea is applied. Since the metal film 2 formed on the portion except the holes 4 is unnecessary, this is removed by the polishing. By executing the polishing, the unnecessary metal film 2 is removed, as shown in FIG. 1S.

In recent years, it is required that an excellent post-polishing shape is attained by such polishing process, because of the further superfine and complex device structure. On the other hand, it is an important object to improve productivity such as a throughput and the like, because of a request for mass productivity.

In conjunction with above explanations, Japanese Laid-Open Patent Application JP-P 2004-296596 A discloses a method of manufacturing a semiconductor device. An object is to attain a high throughput. The document discloses a polishing apparatus that has a plurality of polishing tables and polishing heads, wherein the number of polishing heads is greater than that of the polishing tables. The document discloses a process of attaching to and detaching from a semiconductor substrate with respect to the polishing head which is not used to polish.

Japanese Laid-Open Patent Application JP-P 2000-173959 A (corresponding to U.S. Pat. No. 6,432,825 B1, GB 2344459 A) discloses a method of manufacturing a semiconductor device. The document discloses a surface layer removing process of removing a metal film surface, wherein a polishing is carried out in at least two stages. In a first stage of the polishing, the polishing is executed under a high load. In a second stage of the polishing, the polishing is executed under a load lower than that of the first stage.

We have now discovered a following fact. When the polishing target is polished, there is a case that an over-polishing is carried out in order to remove the polishing residue resulting from the irregularity in the polishing. That is, after a surface layer of the polishing target is polished by a predetermined value, the over-polishing is further executed, thereby removing the polishing residue.

However, when the over-polishing is carried out, there is a case that the time (incubation time) appearing in the initial time of the polishing in which the polishing does not substantially progress becomes long. Such increase in the incubation time is severe when the surface on which both of the metal film and the insulating film are exposed is polished. As the incubation time becomes longer, the throughput becomes lower. Also, when the surface on which both of the metal film and the insulating film are exposed is over-polished, the metal material is apt to be eroded by a polishing solution in the incubation time. That is, the increases in a recess (recession of a wiring pattern caused by erosive action of chemical solution) and erosion (local recession of dense wiring) become problematic. As a reason of such problems, the fact may be considered that exposure of the insulating film causes a rise in a temperature to be difficult immediately after the over-polishing is started, and heat required to polish the metal film is not added.

JP-P 2000-173959 A discloses a technique that reduces the incubation time, when the entire surface of the wafer is the metal film. However, a technique for reducing the incubation time when the surface on which both of the metal film and the insulating film are over-polished is not described in any documents. Thus, the technique that can reduce the incubation time at the time of the over-polishing is desired.

SUMMARY

The present invention seeks to solve one or more of the above problems, or to improve upon those problems at least in part. In one embodiment, a method of manufacturing a semiconductor device, includes: (a) obtaining a surface of a polishing target, wherein an insulating film and a metal film are exposed; and (b) polishing the surface having the exposed insulating film and the exposed metal film. The step (b) includes: (b1) polishing the surface in a condition with high frictional force, and (b2) polishing the surface in a condition with usual frictional force lower than the high frictional force after the step (b1).

As mentioned above, in the step (b) of over-polishing step, polishing is executed at high friction condition such as a high load and/or a high rotation rate in an early stage, and then at low friction condition such as a low load and/or a low rotation rate in a remaining stage. Therefore, in the early stage, a friction between the polishing target and the polishing pad is increased, and consequently generated heat quantity is increased. Thus, it is possible to increase the heat quantity added to the metal film to raise a temperature of the metal film relatively fast. Hence, it is possible to reduce the incubation time and reduce the time required to remove the metal film. As a result, the throughput is improved.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

The first embodiment of the present invention will be described below with reference to the drawings. Here, the following embodiment will be explained with regard to a case of polishing a semiconductor wafer in which tungsten film and TiN/Ti films are embedded as metal films in holes, as one example. However, the idea of the present invention is not limited thereto. The present invention can be applied to the type in which the metal film is embedded in the concave portion formed on the wafer.

Figure 2:
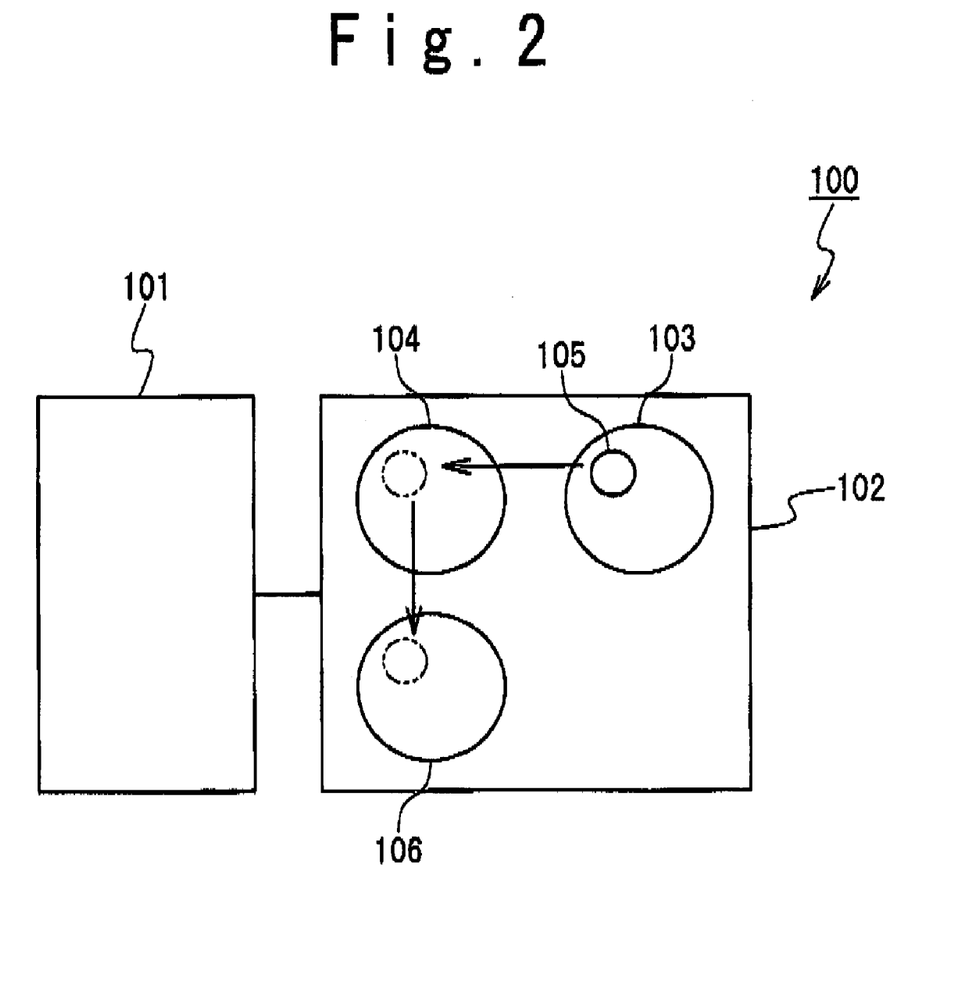
FIG. 2 is a schematic view showing a configuration of a semiconductor device manufacturing apparatus according to a first embodiment.

FIG. 2 is a schematic view showing a configuration of a semiconductor device manufacturing apparatus 100 according to this embodiment. This semiconductor device manufacturing apparatus 100 has a controller 101 and a polishing unit 102. The controller 101 controls an operation of the polishing unit 102. The controller 101 is, for example, a computer that attains its functions by installed programs. The operation of the polishing unit 102, which will be described later, is carried out based on instructions of the controller 101, unless otherwise indicated.

A polishing target 105 polished by the semiconductor device manufacturing apparatus 100 according to this embodiment is the wafer after the metal film 2 (the lamination layer 21 made of TiN/Ti and the tungsten film layer 22) is embedded in the holes 4 formed on the inter-layer insulating film 3 (oxide film), as shown in FIG. 1A. When the metal film 2 is formed, as the metal film 2 is formed even on the portion other than the holes 4, this is in the situation that the metal film 2 is exposed on the entire surface.

In FIG. 2, the polishing unit 102 will be explained below. The polishing unit 102 is a CMP unit in this embodiment. The polishing unit 102 includes three polishing tables. One of the three polishing tables is a tungsten film removing table 103, and another one is a barrier layer removing table 104, and still another one is an over-polishing table 106. A polishing pad (not shown) is stuck on each of the three polishing tables. The polishing target 105 is attached to a polishing head (not shown) and polished by the tungsten film removing table 103, the barrier layer removing table 104 and the over-polishing table 106 in this order.

In this way, since the polishing unit 102 having the plurality of polishing tables is used, a plurality of wafers can be polished at one time. Thus, a throughput can be improved as compared with that in a case using the polishing unit that has a single polishing table.

Figure 3:
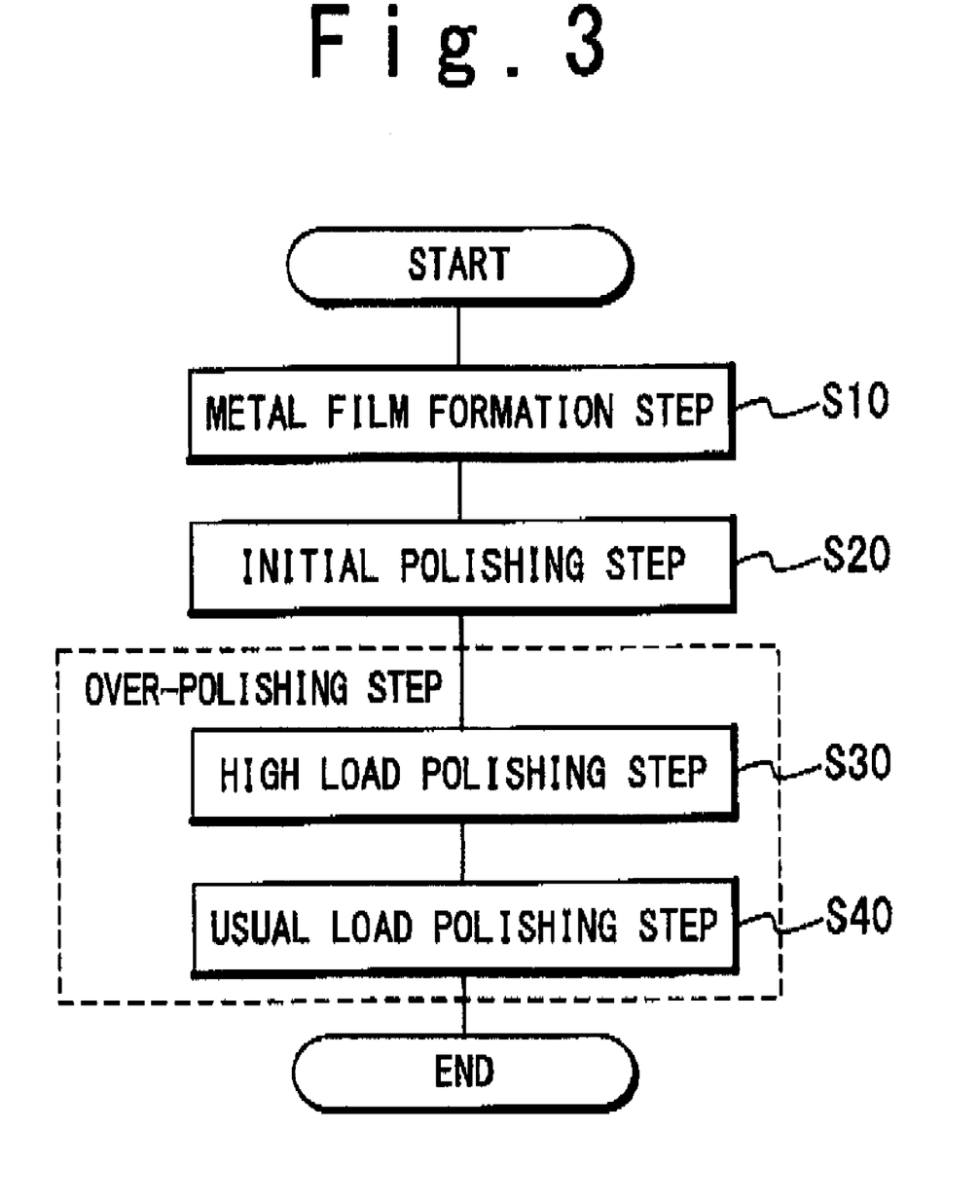
FIG. 3 is a flowchart showing the method of manufacturing the semiconductor device in the first embodiment.

In succession, a method of manufacturing the semiconductor device according to this embodiment will be explained. FIG. 3 is a flowchart showing the method of manufacturing the semiconductor device in this embodiment. The method of manufacturing the semiconductor device includes: a metal film formation step (step S10), an initial polishing step (step S20), and an over-polishing step (steps S30, S40). The operations of the respective steps will be described below in detail with reference to FIGS. 4A to 4D, which are sectional views showing wafers in these polishing steps.

(1) Step S10: Metal Film Formation Step

The semiconductor wafer on which the holes 4 are formed in the inter-layer insulating film 3 is prepared. The metal film 2 is formed over the surface of this semiconductor wafer. The metal film 2 is formed by using, for example, a CVD method and a sputtering method. When the metal film 2 is formed in this way, the holes 4 are embedded with the metal film 2. Also, the surface of the wafer other than the holes 4 is covered with the metal film 2.

(2) Step S20: Initial Polishing Step

Figure 4A:
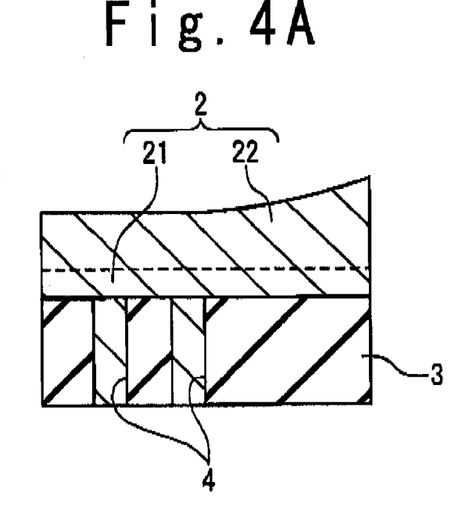
FIGS. 4A to 4D are sectional views showing wafers in a polishing process in the first embodiment.
Figure 4B:
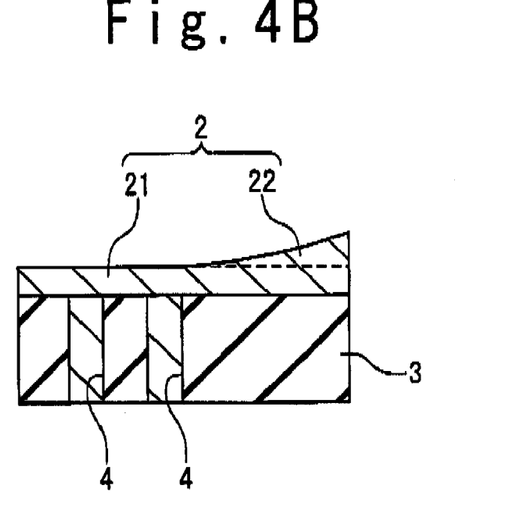

Next, the metal film 2 on the surface of the wafer is polished by the polishing unit 102. At first, the tungsten film removing table 103 is used to polish the tungsten film layer 22, as shown in FIG. 4A. In succession, the barrier layer removing table 104 is used to polish the barrier layer 21, as shown in FIG. 4B. The situation, in which the inter-layer insulating film 3 is exposed on at least a part of the wafer surface, is defined as a final point. When the water reaches the situation, the initial polishing of the metal film 2 is completed. Here, as a method of detecting the final point, it is possible to use the well known method, for example, the detection based on change in a driving voltage or a driving current of the polishing table.

Figure 4C:
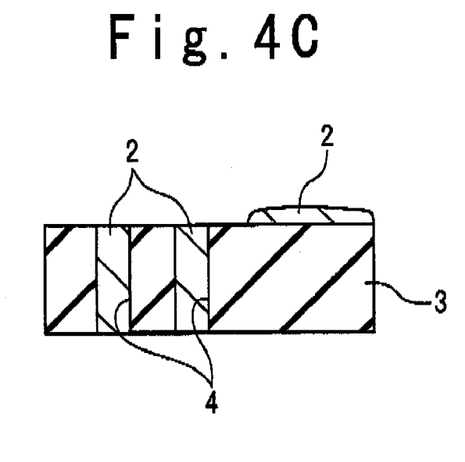

Immediately after the detection of the final point, as shown in FIG. 4C, there is a case that the metal film 2 remains on a part of the wafer surface. In the CMP method and the like in this embodiment, the polishing residue of the metal film 2 is easily generated on the outer periphery side where the polishing speed is relatively slow.

(3) Steps S30 to S40: Over-Polishing Step

Figure 4D:
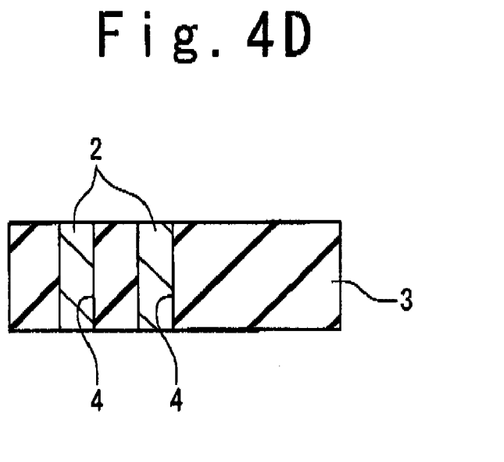
Figure 5:
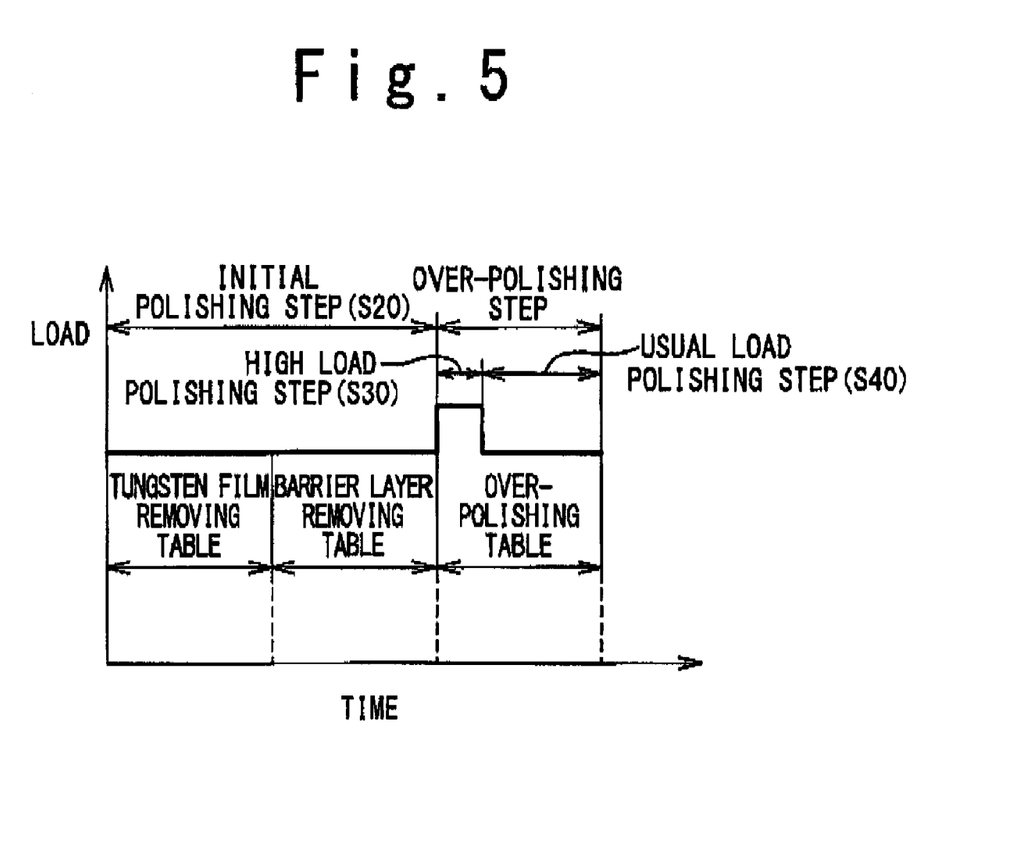
FIG. 5 is a graph showing a relation between a polishing time and a polishing load at polishing steps in the first embodiment.

In succession, the wafer surface is over-polished in order to remove the polished residue. This over-polishing step is carried out on the over-polishing table 106. FIG. 5 is a graph showing a relation between the polishing time and the polishing load, at the initial polishing step (S20) and the over-polishing step (S30, S40) in the first embodiment. When the over-polishing is carried out, the polishing is firstly executed under the high load (High Load Polishing; Step S30). In succession, the polishing is executed under the usual load (the load lower than the load of S30). With the processes at those steps S30, S40, as shown in FIG. 4D, the metal film 2 is removed except the portion of the holes 4. Consequently, the metal film 2 formed on the unnecessary portion is removed.

Incidentally, in the graph shown in FIG. 5, the polishing load in the initial polishing step (S20) is equal to that in the usual over-polishing step (S40). However, the polishing load in the usual load polishing step (S40) is not always required to be equal to the polishing load in the initial polishing step (S20). Also, at the initial polishing step (S20), the case of the polishing for the tungsten film layer and the case of the polishing for the barrier layer are not required to be polished under the same load.

Also, this embodiment is explained with regard to the case in which the tungsten film removing table 103 is used to polish the tungsten film layer 22, and the barrier layer removing table 104 is used to polish the barrier layer 21. However, the tungsten film layer 22 and the barrier layer 21 are not always required to be polished on the different tables. For example, the tungsten film layer 22 may be polished until its middle part on one polishing table, and the remaining tungsten film layer 22 and the barrier layer 21 may be polished on the other polishing table. At this time, the throughput is improved when the respective polishing times of the plurality of polishing tables included in the polishing apparatus 21 are set to be approximately equal.

When the metal film 2 has a film thickness of 400 nm, the polishing time of each step is, for example, between 20 and 50 seconds at the time of the tungsten film polishing at the initial polishing step (the polishing on the tungsten film removing table), between 20 and 50 seconds at the time of the barrier layer polishing step (the polishing on the barrier layer removing table), and between 10 and 50 seconds at the time of the over-polishing step (the total of S30 and S40).

According to this embodiment, the incubation time can be reduced, as compared with the case in which the high load polishing step (S30) is not used. This results from the following reasons.

When friction between the surface of the polishing target and the polishing pad is used to polish such as the CMP method and the like, the polishing speed tends to depend on a temperature of a polished portion. When the surface on which both of the metal film 2 and the inter-layer insulating film 3 are exposed is over-polished, the inter-layer insulating film 3 causes heat generated by the friction to escape. Thus, it is difficult to conduct the heat to the metal film 2, and the temperature is hard to rise. Hence, the incubation time becomes long.

On the contrary, in this embodiment, the high load polishing is executed at the beginning of the over-polishing. Thus, the friction added to the wafer surface is increased, which can increase generated heat quantity. Consequently, the heat quantity applied to the metal film 2 is increased, and the temperature of the metal film 2 is relatively quickly raised. Hence, the incubation time can be reduced, and the time required to remove the metal film 2 can be also reduced. As a result, the throughput is improved.

Also, since the incubation time is reduced, the generations of the recess and the erosion are suppressed. Moreover, the contact time with slurry is reduced, which makes the surface shape after the polishing smoother, and consequently attains the ideal shape.

Also, when the over-polishing step (S30, S40) and the steps (S10, 20) before the over-polishing step are executed on the different polishing tables, the temperature of the polishing portion at the beginning of the over-polishing step is apt to be decreased, as compared with a case when all the polishing steps are executed on the same table. Thus, the reduction effect of the incubation time based on the high load polishing step (S30) as mentioned above becomes more effective.

Incidentally, the polishing load at the high load polishing step (S30) is preferred to be higher than the polishing load at the usual load polishing step (S40) by about 0.5 to 3.5 psi. If the difference between the polishing loads at S30, S40 is smaller than 0.5 psi, it is difficult to sufficiently reduce the incubation time. On the other hand, if this difference is greater than 3.5 psi, the polishing load becomes too high, which may result in the irregular polishing.

Also, the time while the high load polishing step (S30) is executed is preferred to be between 1 and 15 seconds.

Incidentally, as a result of an experiment executed by the inventors, when the polishing was executed under the constant load from the beginning to the end of the over-polishing step, the time required to remove the metal film 2 on the unnecessary portion was 34 seconds. However, the time when the high load polishing step (S30) was used was 28 seconds. At the high load polishing step, the polishing was executed for 10 seconds at 3.8 psi, and at the usual load polishing step, the polishing was executed at 2.3 psi. Also, at both of the high load polishing step and the usual load polishing step, the polishing was executed under the condition that the rotation rate of the polishing table was 1000 rpm and the rotation rate of the polishing head was 100 rpm. Also, from this experiment result, it was confirmed that the installation of the high load polishing step (S30) could reduce the incubation time at the time of the over-polishing and reduce the entire polishing time.

Figure 6:
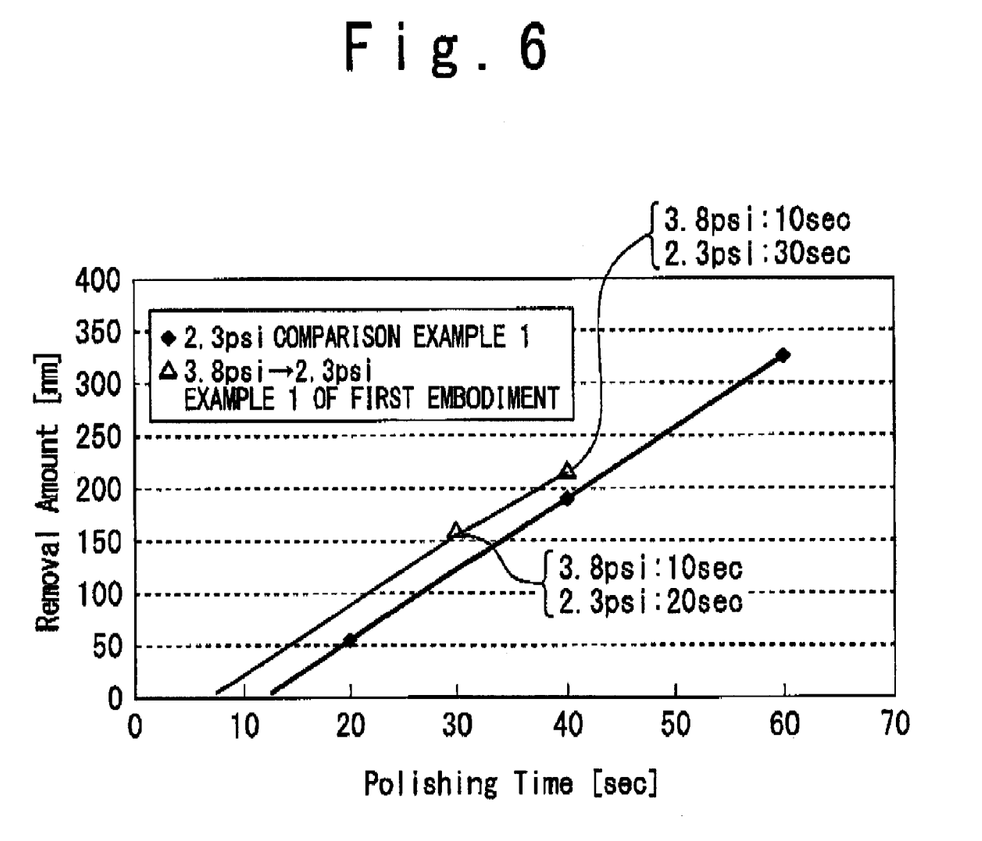
FIG. 6 is a graph showing experiment results of a comparison example and an example of the first embodiment.

FIG. 6 is a graph showing another experiment results executed by the inventors. FIG. 6 is the graph showing a relation between the polishing time and the polishing quantity on the wafer surface. A comparison example 1 shows a result when the polishing load at the over-polishing step was set to 2.3 psi and made constant and the polishing was then executed. An example 1 of the first embodiment shows a result when the high load polishing (3.8 psi) was executed for 10 seconds and then the polishing under the usual load polishing (2.3 psi) was executed. Also, at both the high load polishing step and the usual load polishing step, the polishing was executed under the condition that the rotation rate of the polishing table was 100 rpm and the rotation rate of the polishing head was 100 rpm.

In the example 1 of the first embodiment, the time when the surface polishing was substantially started was about 8 seconds after the step was started. On the other hand, in the comparison example 1, the time when the surface polishing was substantially started was about 12 seconds after the step was started. In this way, it was confirmed that the incubation time of the example 1 of the first embodiment was reduced by about 4 seconds, as compared with the comparison example 1.

Here, this embodiment is explained with regard to the case (a plug formation) in which the Ti/TiN lamination film and the tungsten film are embedded in the metal film. However, this is not limited thereto, and this can be applied to a different metal wiring forming step such as a Cu wiring or via formation. For example, when the Cu wiring is formed, wiring trenches and via holes are formed as concave portions in the insulating film. Then, the barrier metal and the Cu film are formed as the metal film. At this time, the Cu film and the barrier film are also formed on the wafer surface except the concave portion. In order to remove the Cu film and the barrier film which are formed on the portion except the concave portion, the idea of the polishing load as described in this embodiment can be applied. Also, as another example, this can be applied to a case of using a film that includes the lamination film of the Cu film and Ta/TaN as the metal film.

Second Embodiment

The second embodiment of the present invention will be described below. In this embodiment, the operation of the high load polishing step (S30) is further devised for the first embodiment. The operations except the high load polishing step (S30) are similar to those of the first embodiment. Thus, their explanations are omitted.

Figure 7:
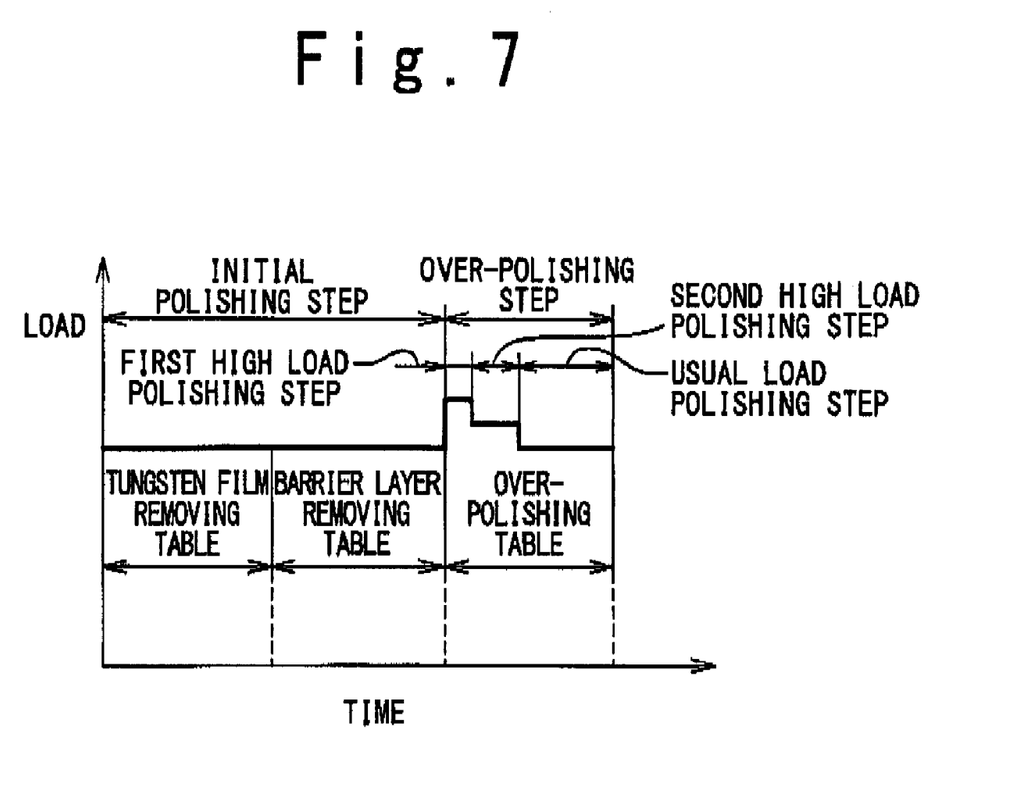
FIG. 7 is a graph showing a relation between a polishing time and a polishing load at polishing steps in a second embodiment.

FIG. 7 is a graph showing a relation between the polishing time and the polishing load, at the initial polishing step (S20) and the over-polishing step (S30, S40) in the second embodiment. In this embodiment, the high load polishing step (S30) has a first high load polishing step and a second high load polishing step. The polishing load of the first high load polishing step is higher than the polishing load of the second high load polishing step. Also, the polishing load of the second high load polishing step is higher than the polishing load of the usual load polishing step. That is, at the over-polishing steps (S30, S40), the polishing load is gradually getting small.

There is a case that the time while the polishing can be executed under the high load is limited depending on strength of the metal film 2. For example, when the film whose strength is relatively weak such as a Low-k film or the like is polished, if the high load polishing step (S30) is executed for a long time, there is a case that the metal film 2 is damaged. According to this embodiment, since the polishing load is gradually decreased, the damage on the metal film 2 can be suppressed while the polishing can be continued under the polishing load higher than that of the usual load polishing step. That is, it is possible to suppress the damage on the metal film 2 and sufficiently reduce the incubation time.

Third Embodiment

The third embodiment will be described below. This embodiment differs from the above-mentioned embodiments in the number of the polishing tables inside the polishing unit 102. The number of the polishing tables is three in the above-mentioned embodiments. However, the number is two in this embodiment. In this embodiment, the metal film 2 is removed on the single polishing table. Here, the explanations with respect to the same configurations and operations as the above-mentioned embodiments are omitted.

Figure 8:
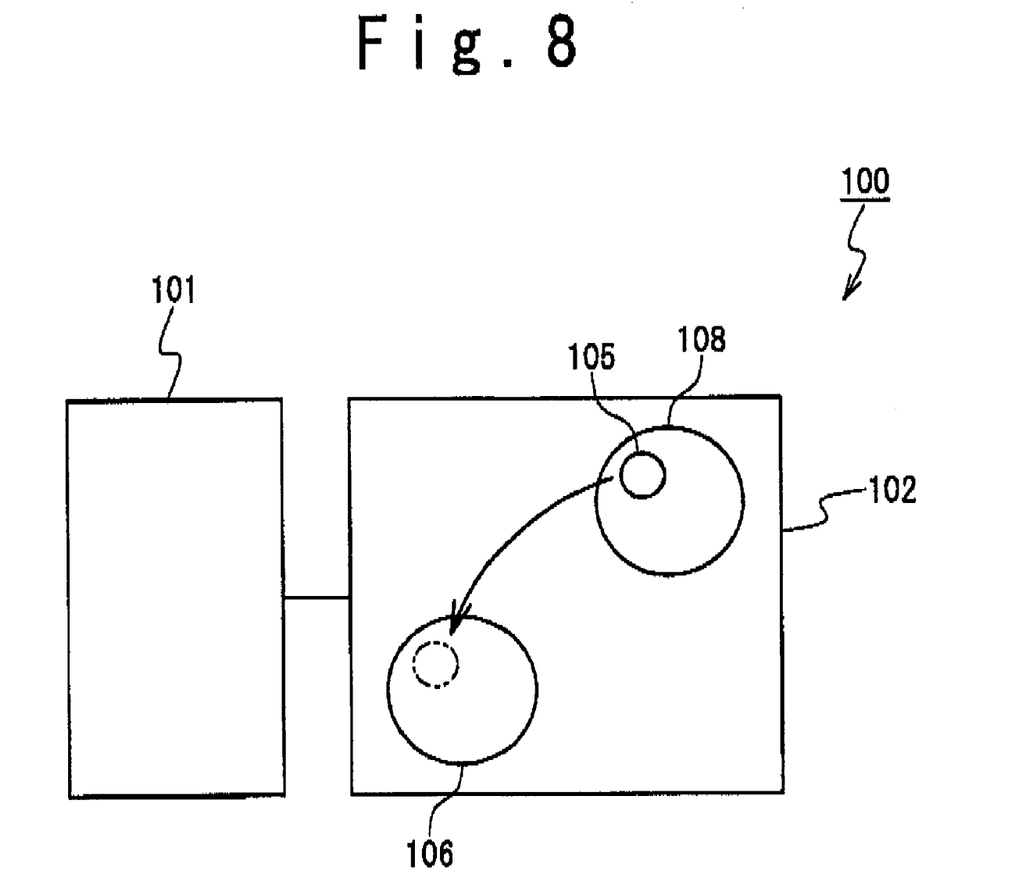
FIG. 8 is a schematic view showing a configuration of a semiconductor device manufacturing apparatus according to a third embodiment.

FIG. 8 is a schematic view showing a configuration of a semiconductor device manufacturing apparatus 100 according to this embodiment. In this embodiment, the two polishing tables are arranged in the polishing unit 102. The two polishing tables are a metal film removing table 108 and the over-polishing table 106. The tungsten film layer 22 and the barrier layer 21 are polished on the metal film removing table 108. The substrate after the completion of the process on the metal film removing table 108 is moved onto the over-polishing table 106, and the over-polishing step is performed thereon, similarly to the above-mentioned embodiments.

Figure 9A:
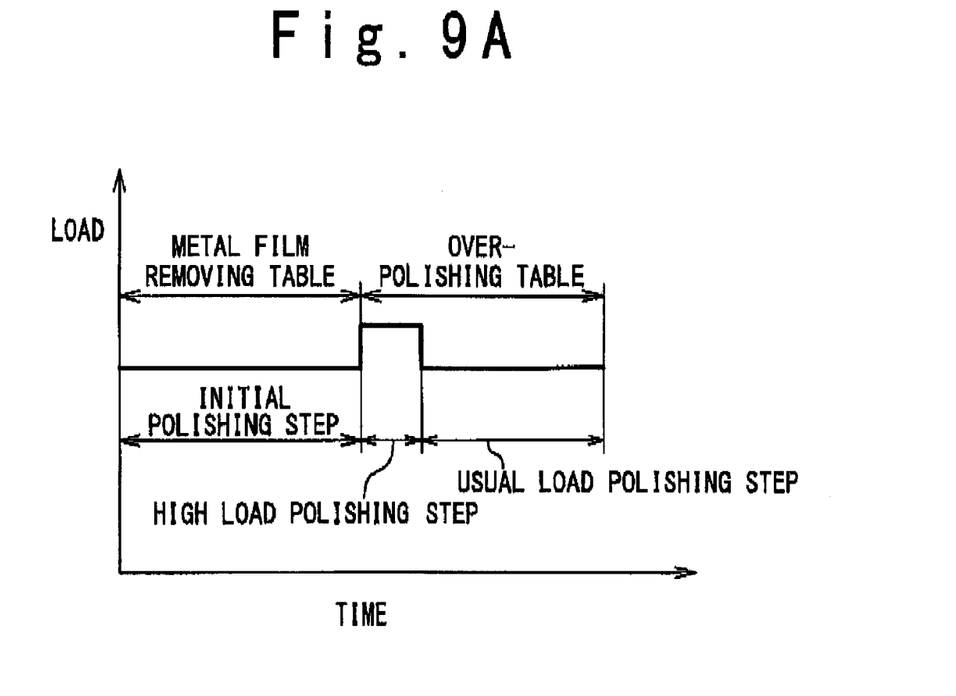
FIGS. 9A and 9B are graphs showing relations between a polishing time and a polishing load at polishing steps in the third embodiment.
Figure 9B:
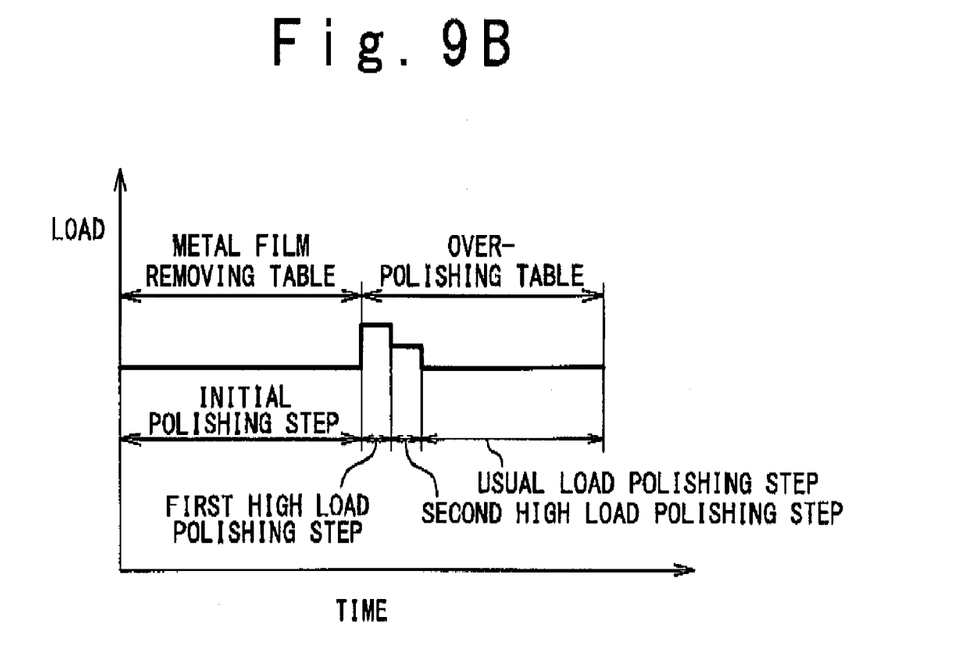

FIGS. 9A and 9B are graphs showing relations between the polishing time and the polishing load, at the initial polishing step (S20) and the over-polishing step (530, S40) in the third embodiment. As shown in FIG. 9A, the over-polishing is executed by the second polishing table. Similarly to the above-mentioned embodiments, the high load polishing step is executed at this time of the over-polishing. FIG. 9A shows the graph when the high load polishing step is one stage, similarly to the first embodiment. FIG. 9B shows the example when the polishing load is gradually decreased in the high load polishing step, similarly to the second embodiment.

In this way, the number of the polishing tables is not always required to be three, differently from the above-mentioned first and second embodiments. If the over-polishing step has the high load polishing step and the usual load polishing step, the number of the polishing tables may be two.

Fourth Embodiment

Figure 10:
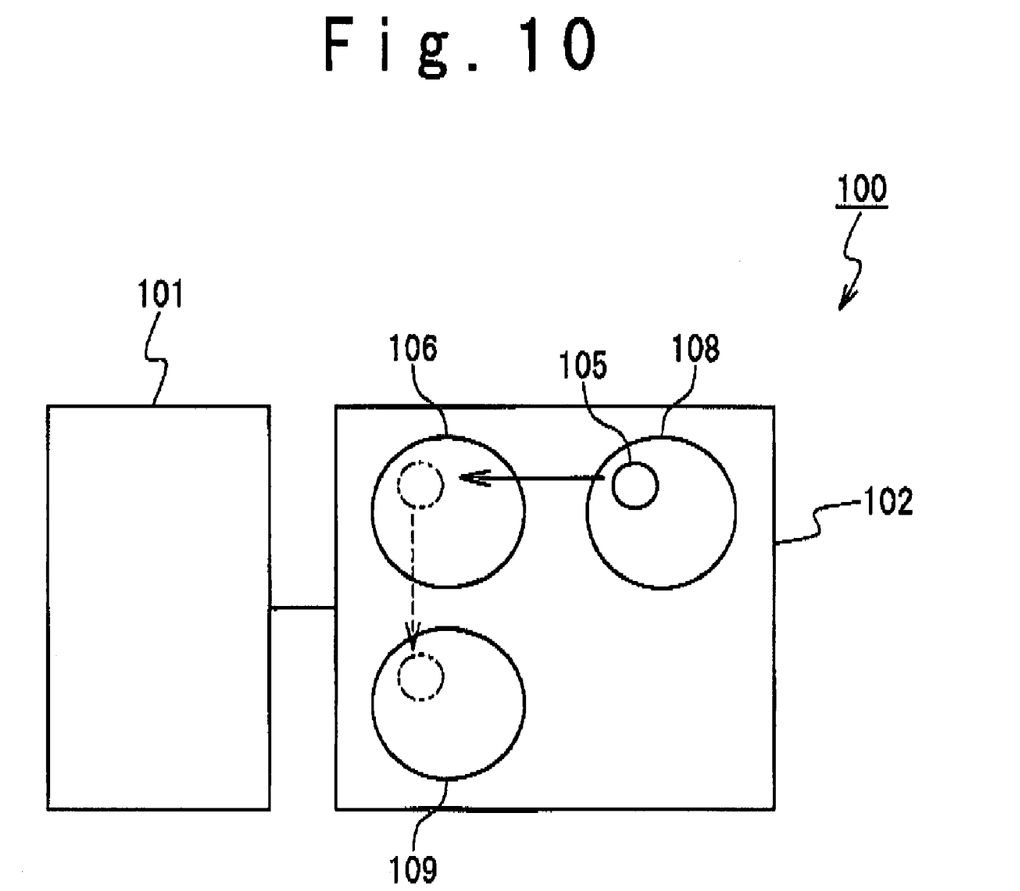
FIG. 10 is a schematic view showing a configuration of a semiconductor device manufacturing apparatus according to a fourth embodiment.

The fourth embodiment of the present invention will be described below. FIG. 10 is a schematic view showing a configuration of a semiconductor device manufacturing apparatus 100 according to this embodiment. The semiconductor device manufacturing apparatus 100 according to this embodiment further includes a finish polishing table 109 in addition to that of the third embodiment. The finish polishing is performed on the wafer after the completion of the over-polishing step by the finish polishing table 109. Here, the explanations of the same configurations and operations as the above-mentioned embodiments are omitted.

Figure 11A:
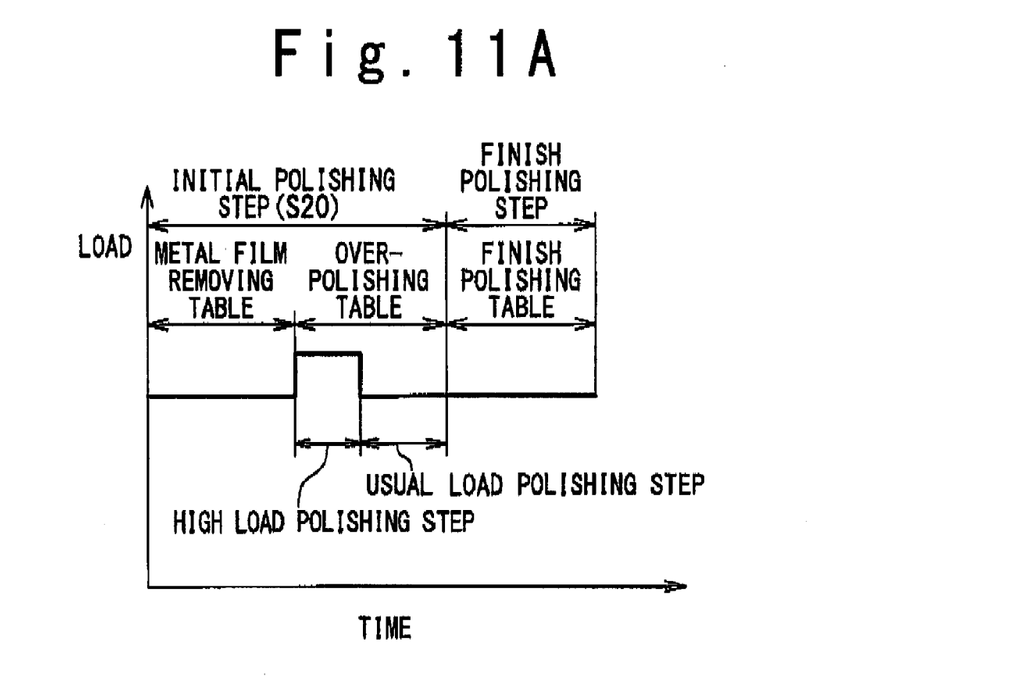
FIGS. 11A and 11B are graphs showing relations between a polishing time and a polishing load at polishing steps in the fourth embodiment.
Figure 11B:
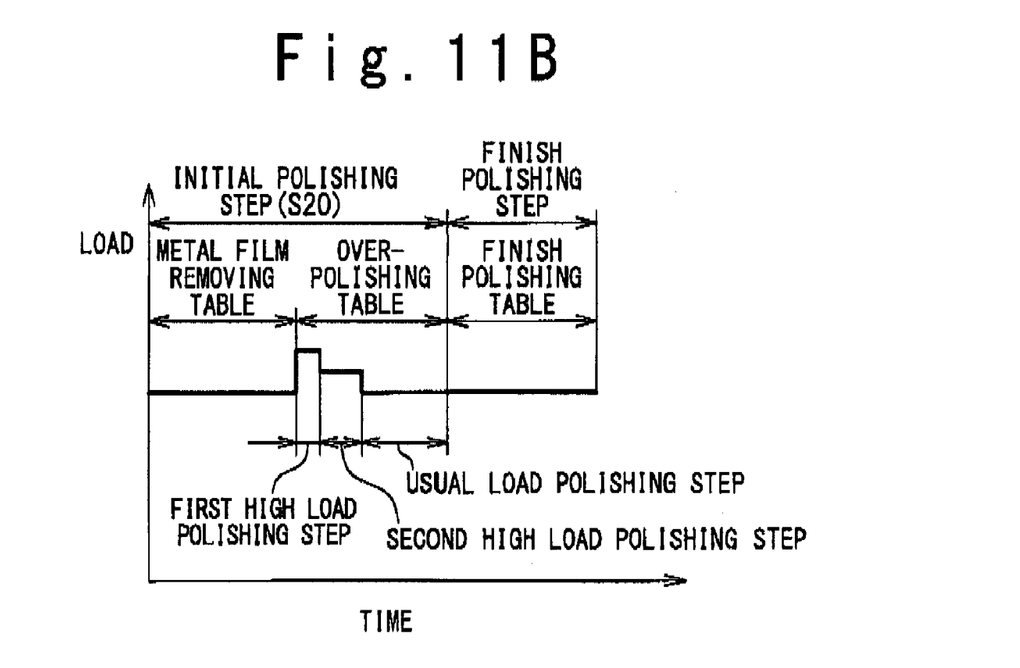

FIGS. 11A and 11B are graphs showing relations between the polishing time and the polishing load, at the initial polishing step (S20) and the over-polishing step (S30, S40) in the fourth embodiment. As shown in FIGS. 11A, 11B, the high load polishing step is executed at the over-polishing step. FIG. 11A shows the graph when the high load polishing step is executed under the constant polishing load, similarly to the first embodiment. FIG. 11B shows the example when the polishing load is gradually decreased at the high load polishing step, similarly to the second embodiment.

As shown in FIGS. 11A, 11B, the finish polishing step is further performed on the wafer after the completion of the over-polishing step. The finish polishing step is executed under the constant polishing load, on the finish polishing table 109. This finish polishing is executed in order to remove the micro polishing flaw remaining after the completion of the over-polishing. Usually, this is executed by using the slurry different from the case of the over-polishing step.

In this way, the over-polishing step is not always required to be executed on the polishing table on which the wafer is finally processed. After the over-polishing step, the different step such as the finish polishing step and the like may be executed on the different table.

Fifth Embodiment

The fifth embodiment will be described below. In this embodiment, a high rotation rate polishing step (S30) is executed instead of the high load polishing step (S30) in the first embodiment as mentioned above. Here, in the high rotation rate polishing step (S30), the polishing is carried out at a high rotation rate. Other configurations and operations can be designed similarly to those of the first embodiment. Thus, the detailed explanation same as the first embodiment is omitted.

Figure 12:
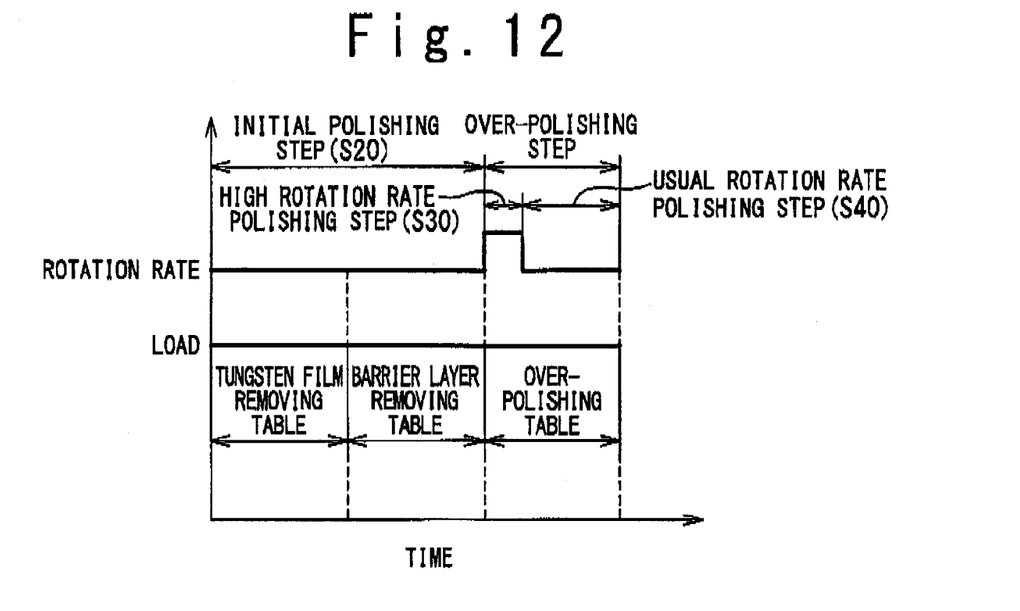
FIG. 12 is a graph showing a relation among a polishing time, a polishing load and a rotation rate at polishing steps in the fifth embodiment.

FIG. 12 is a graph showing a relation among the polishing time, the polishing load and the rotation rate, at the initial polishing step (S20) and the over-polishing step (S30, S40) in the fifth embodiment. At the initial polishing step and the over-polishing steps, while the polishing table on which the polishing pad is stuck is rotated, the wafer attached to the polishing head is pushed against the polishing pad, and the polishing is executed. In this embodiment, when the over-polishing is executed, the polishing is firstly executed at the high rotation rate (the high rotation rate polishing; step S30). After that, the polishing is executed at the usual rotation rate (the rotation rate lower than that of S30) (Step S40). Here, the rotation rate in this case indicates the rotation rate of the polishing table. In those processes of the steps S30, S40, the metal film 2 is removed except the portion of the holes 4, as shown in FIG. 4D. Consequently, the metal film 2 formed on the unnecessary portion is removed. In this embodiment, the polishing loads of the initial polishing step (S20) and the over-polishing steps (S30, S40) are constant.

In the graph shown in FIG. 12, the polishing loads of the initial polishing step (S20) and the usual rotation rate polishing step (S40) are equal. However, it is not necessary that the polishing rotation rate of the usual rotation rate polishing step (S40) is equal to the polishing rotation rate of the initial polishing step (S20). Also, at the initial polishing step (S20), it is not necessary that the rotation rate at the tungsten film polishing is equal to the rotation rate at the barrier layer polishing.

When the metal film 2 has a film thickness of 400 nm, the polishing time of each step is, for example, between 20 and 50 seconds at the time of the tungsten film polishing in the initial polishing step (the polishing on the tungsten film removing table), between 20 and 50 seconds at the time of the barrier layer polishing in the initial polishing step (the polishing on the barrier layer removing table), and between 10 and 50 seconds at the time of the over-polishing (the total of S30 and S40).

The polishing rotation rate of the high rotation rate polishing step is preferred to be higher than the polishing rotation rate of the usual rotation rate polishing step by about 10 to 80 rpm. If a difference of the polishing rotation rate is smaller than 10 rpm, it is difficult to sufficiently reduce the incubation time. On the other hand, if this difference is greater than 80 rpm, the time required to return to the usual rotation rate becomes very long. In this case, the polishing speed may be faster than a desirable value, and this leads to the polished quantity increase which changes the wafer shape after the polishing. Preferably, the execution time of the high rotation rate polishing step is between 1 and 15 seconds.

As described in this embodiment, at the time of the over-polishing, the execution of the high rotation rate polishing step (S30) can also increase the friction applied to the wafer surface and increase the generated heat quantity. Thus, similarly to the first embodiment, it is possible to increase the heat quantity added to the metal film 2 and raise the temperature of the metal film 2 relatively fast. Hence, it is possible to reduce the incubation time and reduce the time required to remove the metal film 2. As a result, the throughput is improved.

Also, the incubation time is reduced, which suppresses the generations of the recess and the erosion. Moreover, the contact time with the slurry is reduced, which consequently makes the surface shape after the polishing smoother and obtains the ideal shape.

Also, when the over-polishing steps (S30, S40) and the steps (S10, S20) prior to the over-polishing steps are executed on the different polishing tables, the temperature of the polished portion at the beginning of the over-polishing step is easily dropped, as compared with the execution on the same table. Thus, the reduction effect of the incubation time resulting from the high rotation rate polishing step (S30) as mentioned above becomes more effective.

Incidentally, this embodiment is explained with regard to the case in which the high load polishing step (S30) in the first embodiment is replaced with the high rotation rate polishing step (S30). However, this may be executed such that the high load polishing step (S30) in the second to fourth embodiments is replaced with the high rotation rate polishing step (S30). That is, as described in the second embodiment, the high rotation rate polishing step may be divided into the two stages so that the rotation rate is gradually decreased. Also, as described in the third embodiment, the high rotation rate polishing step may be applied to the case in which the number of the polishing tables is two. Also, as described in the fourth embodiment, the finish polishing step may be added after the over-polishing.

Sixth Embodiment

The sixth embodiment will be described below. The first to fifth embodiments are explained with regard to the case in which any of the high load polishing step and the high rotation rate polishing step is executed at the beginning of the over-polishing step. On the other hand, in this embodiment, the polishing is executed at the high rotation rate under the high load. Other configurations and operations can be designed similarly to those of the above-mentioned embodiments. Thus, the detailed explanation same as the above-mentioned embodiments is omitted.

Figure 13:
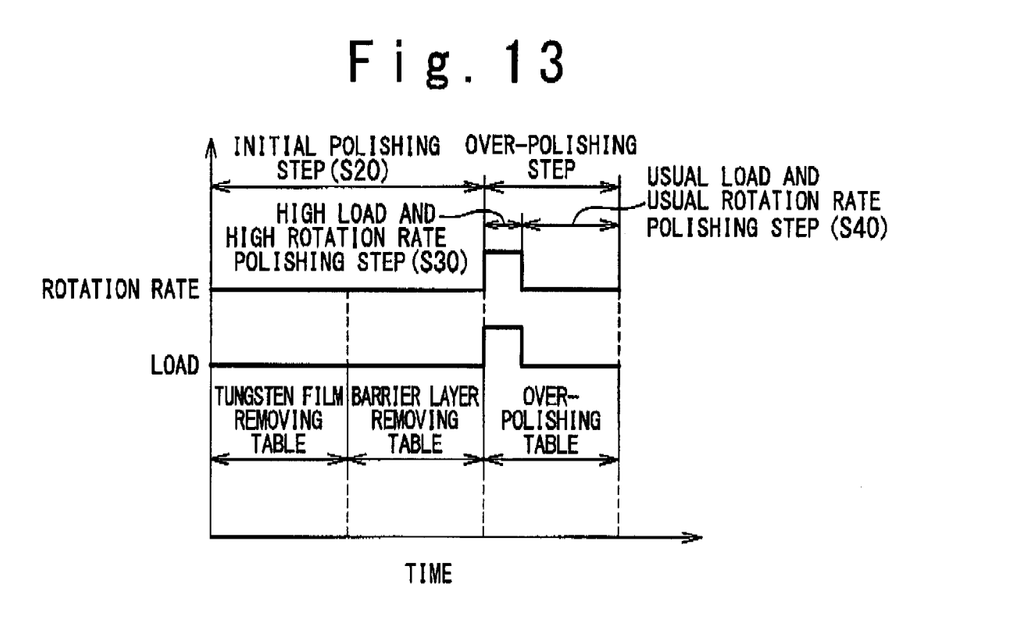
FIG. 13 is a graph showing a relation among a polishing time, a polishing load and a rotation rate at polishing steps in the sixth embodiment.

FIG. 13 is a graph showing a relation among the polishing time, the polishing load and the rotation rate, at the initial polishing step (S20) and the over-polishing step (S30, S40) in the sixth embodiment. In this embodiment, when the over-polishing is executed, the polishing is firstly executed at the high rotation rate under the high load (the high load and high rotation rate polishing; the step S30). In succession, the polishing is executed at the usual rotation rate under the usual load (the usual load and usual rotation rate polishing; the step S40). Here, the rotation rate in this case indicates the rotation rate of the polishing table. In those processes of the steps S30, S40, the metal film 2 is removed except the portion of the holes 4, as shown in FIG. 4D. Thus, the metal film 2 formed on the unnecessary portion is removed.

As described in this embodiment, at the beginning of the over-polishing, by executing the polishing at the high rotation rate under the high load, it is possible to increase the friction applied to the wafer surface and increase the generated heat quantity. Thus, similarly to the first embodiment, it is possible to increase the heat quantity added to the metal film 2 and raise the temperature of the metal film 2 relatively fast. Hence, it is possible to reduce the incubation time and reduce the time required to remove the metal film 2. As a result, the throughput is improved.

At this time, since the high load and the high rotation rate are set, the heat quantity resulting from the frictional force applied to the wafer surface can be synergistically increased, which can effectively raise the temperature at the time of the polishing.

Incidentally, this embodiment is explained with regard to the case in which the high load polishing step and the high rotation rate polishing step in the first and fifth embodiments are replaced with the high load and high rotation rate polishing step (S30). However, this may be executed such that the high load polishing step (S30) in the second to fourth embodiments is replaced with the high load and high rotation rate polishing step (S30).

According to the present invention, a method and an apparatus of manufacturing the semiconductor device, which can reduce the incubation time at the time of the over-polishing, can be provided.

It is apparent that the present invention is not limited to the above embodiment, but may be modified and changed without departing from the scope and spirit of the invention.

What is claimed is:

1. A method of manufacturing a semiconductor device, comprising: (a) obtaining a surface of a polishing target, wherein an insulating film and a metal film are exposed, and a part of said metal film is on said insulating film; and (b) polishing said surface having said exposed insulating film and said exposed metal film, wherein said step (b) includes: (b1) polishing said surface in a condition with high frictional force, and (b2) polishing said surface in a condition with usual frictional force lower than said high frictional force after said step (b1);
wherein said step (b1) includes: (b11) polishing said surface under a high load, wherein said step (b2) includes: (b21) polishing said surface under a usual load lower than said high load after said step (b11) and
wherein said step (b1) includes: (b11) polishing said surface under a high load for a duration of 1 to 15 seconds.

2. The method of manufacturing a semiconductor device, according to claim 1, wherein said step (a) includes: (a1) forming concave portion in an insulating film which is formed on said polishing target, (a2) forming a metal film such that said metal film covers said concave portion and said insulating film and (a3) polishing said metal film to expose at least a part of said insulating film.

3. The method of manufacturing a semiconductor device, according to claim 1, wherein a polishing table where said step (a) is executed is different from a polishing table where said (b) is executed.

4. The method of manufacturing a semiconductor device, according to claim 1, wherein said metal film includes:
a barrier layer including TiN layer, and
a tungsten film layer formed on said barrier layer.

5. The method of manufacturing a semiconductor device, according to claim 4, wherein said barrier layer is a lamination layer including TiN and Ti.

6. The method of manufacturing a semiconductor device, according to claim 4, wherein said step (a) includes:
(a4) removing said tungsten film layer, and
(a5) removing said barrier layer,
wherein a polishing table where said step (a4) is executed is different from a polishing table where said (a5) is executed.

7. The method of manufacturing a semiconductor device, according to claim 1, wherein said metal film includes: a copper film.

8. The method of manufacturing a semiconductor device, according to claim 7, wherein said metal film further includes: a lamination film including Ta and TaN.

9. The method of manufacturing a semiconductor device, according to claim 1, wherein said step (b11) includes:
(b111) polishing said surface under a first high load, and
(b112) polishing said surface under a second high load lower than said first high load and higher than said usual load, after said step (b111).

10. A method of manufacturing a semiconductor device, comprising: (a) obtaining a surface of a polishing target, wherein an insulating film and a metal film are exposed, and a part of said metal film is on said insulating film; and (b) polishing said surface having said exposed insulating film and said exposed metal film, wherein said step (b) includes: (b1) polishing said surface in a condition with high frictional force, and (b2) polishing said surface in a condition with usual frictional force lower than said high frictional force after said step (b1);
wherein said step (b) includes:
(b3) rotating a polishing table on which a polishing pad is stuck and pushing said polishing target against said polishing pad to polish said surface,
wherein said step (b1) includes:
(b12) polishing said surface at a high rotation rate of said polishing table,
wherein said step (b2) includes: (b22) polishing said surface at a usual rotation rate of said polishing table lower than said high rotation rate after said step (b12),
wherein said step (b1) includes: (b12) polishing said surface at a high rotation rate of said polishing table for a duration of 1 to 15 seconds.

11. The method of manufacturing a semiconductor device, according to claim 10, wherein said step (b12) includes:
(b121) polishing said surface at a first high rotation rate, and
(b122) polishing said surface at a second high rotation rate lower than said first high rotation rate and higher than said usual rotation rate, after said step (b121).

12. The method of manufacturing a semiconductor device, according to claim 1, further comprising:
(c) changing slurry and executing a finish polishing to finish said surface after said step (b).

13. The method of manufacturing a semiconductor device, according to claim 1, wherein said polishing target is a film formed over a semiconductor wafer.

14. The method of manufacturing a semiconductor device, according to claim 1, wherein said step (b) is executed by CMP (Chemical Mechanical Polishing) method.

15. The method of manufacturing the semiconductor device of claim 1, wherein the polishing said surface in a condition with high frictional force is performed for a duration of 10 to 50 seconds.

16. The method of manufacturing the semiconductor device of claim 1, wherein the polishing said surface in a condition with usual frictional force is performed for less time than the polishing said surface in a condition with high frictional force.

17. The method of manufacturing the semiconductor device of claim 1, wherein the polishing said surface under a high load is performed for less time than the polishing said surface under a usual load.

18. The method of manufacturing the semiconductor device of claim 10, wherein the polishing said surface in a condition with high frictional force is performed for a duration of 10 to 50 seconds.

19. The method of manufacturing the semiconductor device of claim 10, wherein the polishing said surface in a condition with usual frictional force is performed for less time than the polishing said surface in a condition with high frictional force.

* * * * *